United States Patent [19]

Sachdev et al.

[11] Patent Number: 5,312,717
[45] Date of Patent: May 17, 1994

[54] RESIDUE FREE VERTICAL PATTERN TRANSFER WITH TOP SURFACE IMAGING RESISTS

[75] Inventors: Harbans S. Sachdev, Hopewell Junction; John C. Forster, Poughkeepsie; Leo L. Linehan, Walden, all of N.Y.; Scott A. MacDonald, San Jose, Calif.; K. Paul L. Muller, Wappingers Falls, N.Y.; Walter E. Mlynko, Colchester; Linda K. Somerville, W. Bolton, both of Vt.

[73] Assignee: International Business Machines Corporation, Armonk, N.Y.

[21] Appl. No.: 949,963

[22] Filed: Sep. 24, 1992

[51] Int. Cl.$^5$ .......................... G03F 7/36; G03C 5/00
[52] U.S. Cl. .................................. 430/313; 430/317; 430/325; 430/326; 430/330; 156/643; 156/646; 156/659.1
[58] Field of Search ............... 430/311, 313, 314, 315, 430/317, 325, 326, 330; 156/628, 643, 646, 659.1, 904; 427/38, 43.1, 53.1, 54.1

[56] References Cited

U.S. PATENT DOCUMENTS

| | | | |
|---|---|---|---|
| Re. 33,108 | 11/1989 | Ishikawa et al. | 156/659.1 |
| 3,772,102 | 11/1973 | Itemann et al. | 156/13 |
| 4,320,191 | 3/1982 | Yoshikawa et al. | 430/296 |
| 4,357,369 | 11/1982 | Kilichowski et al. | 427/90 |
| 4,407,850 | 10/1983 | Bruce et al. | 427/38 |
| 4,426,247 | 1/1984 | Tamamura et al. | 156/643 |
| 4,447,824 | 5/1984 | Logan et al. | 357/71 |
| 4,552,833 | 11/1985 | Ito et al. | 430/325 |
| 4,806,199 | 2/1989 | Gualandris | 156/643 |
| 4,810,601 | 3/1989 | Allen | 430/311 |
| 4,908,298 | 3/1990 | Hefferon et al. | 430/313 |
| 5,094,936 | 3/1992 | Misium | 430/313 |
| 5,123,998 | 6/1992 | Kishimura | 430/313 |
| 5,139,925 | 8/1992 | Hartney | 430/326 |

OTHER PUBLICATIONS

"Magnetically Confined Dry Etching for Silylated Resist Development" by P. Laporte, et al., Solid State Technology, Apr. 1991.
"Dry Development and Trilevel Resist Etching in a DECR Reactor" by J. Dijkstra et al., Microelectronic Engineering 14 (1991), 259–268.
"Oxygen Plasma Etching of Silylated Resist in a Top-Imaging Lithographic Process" by J. Dijkstra, SPIE vol. 1466 Advances in Resist Technology and Processing, 1991, pp. 592–603.
"Etch and Silylation Selectivity for a Dry Developable Resist System," Linda K. Somerville et al., Dielectric Science and Technology and Electronics Divisions, Proc. vol. 92–6.
"Desire: a novel dry developed resist system" by F. Coopmans & B. Roland, SPIE vol. 631 Advances in Resist Technology and Processing III (1986).
"Silylated Acid Hardened Resist (SAHR) Technology: Positive, Dry Developable Deep UV Resists" by J. Thackeray et al., SPIE vol. 1185 Dry Procesing for Submicrometer Lithography (1989).

(List continued on next page.)

Primary Examiner—Marion E. McCamish
Assistant Examiner—Kathleen Duda
Attorney, Agent, or Firm—Michael J. Balconi-Lamica

[57] ABSTRACT

A method for transferring a pattern through a photoresist layer in the fabrication of submicron semiconductor devices structures is disclosed. A photoresist is provided on a substrate and the same is imagewise exposed with a desired pattern to form exposed and unexposed patterned areas in the top surface of the photoresist. The photoresist is then baked to form cross-linked regions in the exposed pattern areas of the photoresist. Silylation is then performed to incorporate silicon into the unexposed patterned areas of the photoresist, wherein some incorporation of silicon occurs in the exposed patterned crosslinked areas of the photoresist. The patterned photoresist is subsequently etched using a high density, low pressure, anisotropic O$_2$ plasma alone to produce residue-free images with vertical wall profiles in the photoresist. This method is particularly advantageous with RFI reactive ion etch systems.

4 Claims, 3 Drawing Sheets

OTHER PUBLICATIONS

"Application of Plasmask© resist and the DESIRE process to lithography at 248 nm" by R. Hutton et al., J. Vac. Sci. Technol. B 8 (6), Nov./Dec. 1990.

"Surface Imaging Techniques" by B. Roland, Microelectronics Engineering 13 (1991) 11-18.

"Optimisation of a Pure Oxygen, Two Step Dry Development Technique for the DESIRE Process"0 by R. Lombaerts et al., Microelectronic Engineering 11 (1990) 543-547.

"The Mechanism of the Desire Process" by B. Roland et al., SPIE vol. 771 Advances in Resist Technology and Processing IV (1987).

RESIDUE FREE VERTICAL PATTERN TRANSFER WITH TOP SURFACE IMAGING RESISTS

BACKGROUND OF THE INVENTION

1. Field of the Invention

The present invention relates generally to top surface imaging processes, and more particularly to residue free patterning in to surface imaging resists.

2. Discussion of the Related Art

Fabrication of very large scale integrated circuits (VLSI) and ultra large scale integrated circuits (ULSI) requires that the resist materials, lithographic processes, and exposure tools meet necessary performance demands for high throughput manufacturing of sub-micron feature size devices (i.e., devices with feature sizes less than 1.0 µm). In the instance of sub-micron lithography, top surface imaging is used to increase the resolution capability of optical exposure systems. Several TSI processes have been developed, most notably, Roland and Coopman's Diffusion Enhanced Silylated Resist (DESIRE) negative tone process, as discussed in F. Coopmans and B. Roland, Proc. of SPIE, 631 (1986), 34–39; B. Roland, R. Lombaerts, C. Jakus, and F. Coopmans, SPIE, Proc. of SPIE, 771 (1987), 69–76; and Roland, Microelectronic Eng., 13 (1991), 11–18. Another TSI process is the positive tone Silylated Acid Hardened Resist (SAHR) developed by Thackeray et al. as discussed in J.W. Thackeray, J F. Bohland, E.K. Pavelchek, G.W. Orsula, A.W. McCullough, S.K. Jones, S.M. Bobbio, Proc. of SPIE, 1185 (1989), 2–11.

Top surface imaging in general uses reactive ion etching (RIE) to dry develop patterns after exposure and silylation of a photoresist layer. A dry development process for top surface imaging requires high selectivity between exposed and unexposed regions of the photoresist to maintain critical dimensions, high anisotropy to give vertical profiles in the patterned photoresist and should also result in no residues after etching.

A major problem with known TSI resist processes is that RIE residue, in the form of "grass", is produced. RIE grass is a problem in both positive and negative working systems, since residue free images are desired. The grass is produced as a result of silicon being incorporated into regions to be etched, such that micromasks are formed in those regions, thus preventing the desired regions from being completely etched during etching, resulting in the "grass"-like residue.

It is known that the RIE grass problem can be eliminated by use of a two-step etch process for pattern development. The first step is a non-selective and aggressive process which removes silicon from the regions to be etched, either chemically using fluorine plasma or RIE, or physically using ion sputtering. The second step is a high selectivity oxygen etch to develop a grass free pattern. This two-step process is disadvantageous since it involves multiple process steps which introduce undesired effects, such as, process instability.

R. Lombaerts, B. Roland, A. Selino, A.M. Goethals, and L. Van den hove, Microelectron. Eng., 11 (1990), 543–547, discusses a method for optimizing an etch process for the DESIRE top surface imaging process using a two step etch process. The first step comprises a $C_2F_6/O_2$ step to remove unwanted silicon from areas to be etched. The second step comprises a pure oxygen low power etch for pattern transfer. An alternate etch process included a two step oxygen only RIE process to obtain grass free results. The first step comprises a high power etch with low selectivity to remove unwanted silicon and further having a greater sputtering component in the etching process. The second step comprises a low power etch with high selectivity for grass free pattern transfer.

R.S. Hutton, R.L. Kostelak, O. Nalamasu, A. Kornblit, S. McNevin, and G.N. Taylor, "Application of Plasmask Resist and the DESIRE Process to Lithography at 248 nm", J. Vac. Sci. Technol. B, Microelectron. Process Phenom. (USA), Vol. 8, No. 6, Nov. Dec. 1990, p. 1502–8, discloses a method in developing a grass free RIE etch for the DESIRE process, employs a two-step etch wherein the first step comprises $Ar^+$ ion sputtering to remove unwanted silicon prior to the second oxygen RIE step to obtain grass free images. In this process, significant amounts of resist are sputtered away prior to the second $O_2$ RIE in order to minimize grass formation. This however results in patterns with considerable edge roughness.

The above discussed processes, however, are disadvantageous in the manufacturing environment. In particular, process stability is a major concern when using two-step fluorine containing etches. Residual fluorine in the $O_2$ RIE step can have a catastrophic effect on linewidth control during pattern development which results from deposition of varying amounts of carbon fluorine C,F polymer on the walls of the RIE chamber. This material then keeps on being released in the etching ambient with attendant variation in the process, resulting in an unstable process. That is, the chamber conditions change with each subsequent wafer.

Another disadvantage in using multi-chamber processes to improve stability is that it slows manufacturing throughput and increases total process time. Additionally, two step processes using sputtering to eliminate grass formation rely on a high selectivity $O_2$ RIE which has a low etch rate. This low etch rate results in longer process times and a loss in throughput.

Thus it would be desirable to provide a process for top surface imaging to overcome the above identified problems and disadvantages. In particular, it would be desirable to provide a top surface imaging pattern transfer process for the fabrication of sub-micron feature size devices which is simple, provides high etch rates, and provides residue free images.

SUMMARY OF THE INVENTION

An object of the present invention is to provide a method for achieving a vertical wall profile in a TSI resist with residue free patterns.

Another object of the present invention is to use $O_2$ only as the etchant gas.

Another object of the invention is to provide a method requiring a minimum bias for TSI resist patterning.

Yet another object is to provide a method for pattern transfer using TSI that results in high etch rates commensurate with "clustered" or high throughput manufacturing.

According to the invention, a method for transferring a pattern through a photoresist layer in the fabrication of submicron semiconductor device structures comprises the steps of:

a) providing the photoresist on a substrate;

b) exposing the photoresist with a desired pattern to form exposed and unexposed patterned areas in the top surface of the photoresist;

c) baking the photoresist to form cross-linked regions in the exposed pattern areas of the photoresist;

d) silylating the photoresist to incorporate silicon into the unexposed patterned areas of the photoresist, wherein some incorporation of silicon occurs in the exposed patterned crosslinked areas of the photoresist; and e) etching the patterned photoresist utilizing a high density, low pressure, anisotropic $O_2$ plasma alone to produce residue-free images with vertical wall profiles in the photoresist.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

Figure 1A:
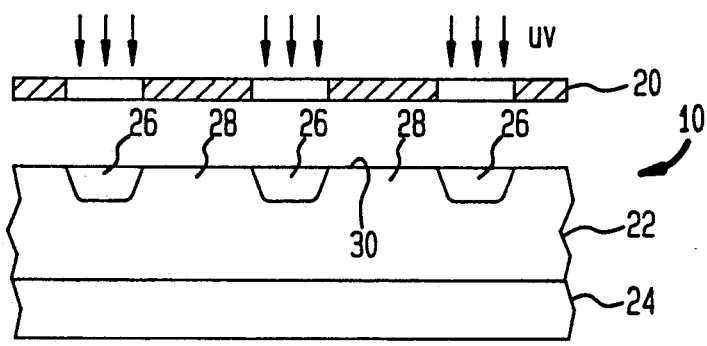
FIG. 1 (a)-(d) show patterning of a photoresist layer in the fabrication of a submicron semiconductor device according to a preferred embodiment of the present invention.
Figure 1B:
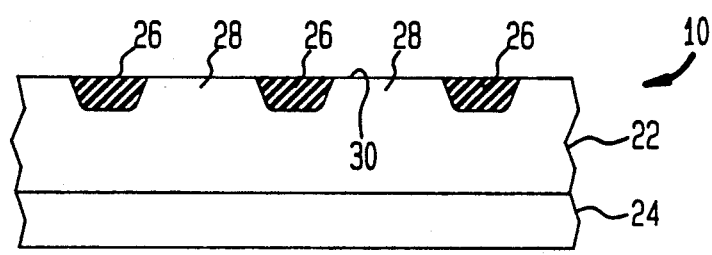
Figure 1C:
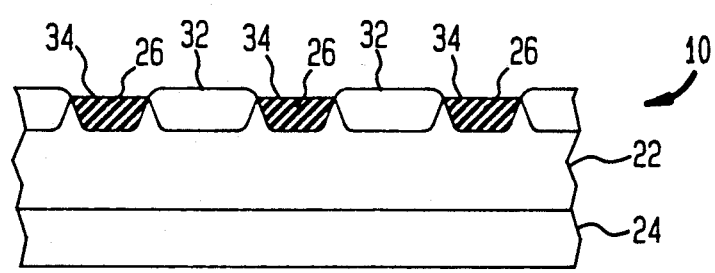

According to the present invention, a method for transferring a pattern provided through a photoresist layer in the fabrication of submicron semiconductor device structures comprises an $O_2$ Reactive Ion Etching (RIE) process which affords residue-free pattern transfer with TSI. The method further provides vertical wall profile, minimum bias, and high etch rates commensurate with "clustered" or high throughput manufacturing.

A typical TSI resist material for use with the method of the present invention comprises (i) film-forming aromatic polymer resin having functional groups which activate the resin to stabilize the resin to electrophilic aromatic substitution, (ii) an acid catalyzable crosslinking agent which forms a carbonium ion upon reaction with acid, and (iii) a radiation degradable acid generator which is adapted to absorb imaging radiation, such that, upon crosslinking, the resist composition is more highly densified and is less permeable to the absorption of an organometallic reagent in the crosslinked regions than it is in the non-crosslinked regions. With respect to the resist, the functional groups of the aromatic polymer resin can comprise phenolic hydroxy groups. The aromatic polymer resin can likewise be selected from the group consisting of poly(hydroxystyrene), poly(hydroxystyrene-co-$t$-butyloxycarbonyl-oxystyrene-poly(-hydroxy-styrene-co-hydroxy-methylstyrene), poly(hydroxystyrene-co-acetoxy-methylstyrene), and novolak resin. The carbonium ion formed can comprise a benzyl carbonium ion. The acid catalyzable crosslinking agent which forms the benzyl carbonium ion upon reaction with acid can comprise a polyfunctional monomer. The organometallic reagent can be in liquid or gaseous form.

Such a resist is disclosed in commonly assigned U.S. patent application Ser. No. 07/796,527, Clecak et al., filed Nov. 22, 1991 and incorporated herein by reference.

We have discovered that high density plasma in the low pressure regime (0.5 to 10.0 mTorr) is important to achieve "grass-free" (i.e., no residue) pattern transfer of images with TSI. This is accomplished with a single gas, namely, oxygen in an etching chamber and requires no additional gases, such as, $CF_4$ or $CHF_3$ as used in the previously described two-step processes. We have further discovered that high gas flow rate during etching is equally important. A gas exchange rate in the etching chamber of 10-50 times per second (sccm) is needed. The high density plasma used in the present invention is preferably obtained with the assistance of a generator which is independent of the Radio Frequency (RF) biased cathode on which the substrate to be etched is located.

In a preferred embodiment, a Radio Frequency Induction (RFI) reactive ion etch (RIE) system (not shown) is used which comprises, more particularly, a radio frequency induction multipole plasma processor having magnetic confinement of a plasma. Such an RFI plasma processor is disclosed in commonly assigned U.S. patent application Ser. No. 07/565,851, Coultas et al., filed Aug. 10, 1990 and incorporated herein by reference. The RFI RIE processor is an efficient processor and can be used for etching and/or deposition processing.

Briefly, the RFI RIE processor includes a chamber for plasma processing having an external wall for housing a work piece, the work piece having a surface to be plasma processed. A source of an induction field is located outside the chamber on its opposite side from the work piece. A radio frequency (RF) induction field applied to the chamber generates the plasma. The plasma is confined within the external wall in the chamber by magnetic dipoles providing a surface magnetic field for confining the plasma. The surface magnetic field is confined to the space adjacent to the external wall. An RF generator provides an RF generated bias to the work piece.

Additionally, the chamber of the RFI processor is lined with a material inert to a plasma or non-contaminating to the work piece. The induction source is in the form of a spiral or involute shaped induction coil and is located on the exterior of the liner material on the opposite side of the chamber from the work piece. Distribution of gas to the chamber is uniform because a manifold (located about the periphery of the chamber) and an orifice (formed by the surface of the chamber and the manifold) admits gas from the manifold into the chamber at a uniform pressure about the periphery of the cover of the chamber.

The work piece or substrate to be processed in the RFI processor is preferably held in place by an electrostatic chuck equipped with helium backside cooling. Such an electrostatic chuck is disclosed in commonly assigned U.S. patent application Ser. No. 07/694,698, Logan et al., filed May 2, 1991 and incorporated herein by reference. In short, the electrostatic chuck includes a means for cooling the backside of the wafer using a cooling gas as the front side of the wafer is being processed.

Referring ngw to FIGS. 1(a)-1(d), in the preferred embodiment, the method of transferring a pattern 20 through a photoresist layer 22 in the fabrication of a submicron semiconductor device structure 10 comprises the following steps. A silicon wafer or substrate 24 is first $O_2$ plasma cleaned and surface treated with 0.1% solution of gamma-aminopropyl triethoxysilane (A1100) in aqueous ethanol by spin application. The wafer is then baked at 90° C. for 1 minute.

A negative working resist 22, comprising the TSI resist material as previously describe herein, is spin applied to the top surface of substrate 24 at 3000 rpm for 30 seconds to provide a 1-2 μm thick film after baking the wafer at 90° C. for 2 minutes. The resist 22 carries a crosslinker, a photo acid generator, a light-absorber, and a host resin for film forming as described in commonly assigned U.S. patent application Ser. No. 07/796,527.

The resist 22 is thereafter imagewise exposed to a Deep Ultra Violet (DUV) source at 5-10 mJ/cm$^2$ through mask 20, the mask 20 having a desired pattern thereon. Imagewise exposing the photoresist 22 with mask 20 forms exposed and unexposed regions 26 and 28, respectively, in a top surface 30 of resist 22 thereby forming an imagewise patterned resist 22 (FIG. 1(a)). Imagewise patterned resist 22 is thereafter heated at 100°-130° C. for 2-5 minutes to produce cross-linked regions in the exposed patterned areas 26 in top surface 30 of the photoresist 22 (FIG. 1(b)).

After the crosslinked regionsare formed, the device structure 10, and in particular, resist 22 is silylated in a silylation tool. Resist 22 can be silylated with a silylating gas such as dimethylanimo-trimethyl silane. Silylation is well known in the art and thus only briefly discussed herein. Silylaton is a process wherein silicon is selectively incorporated into the top surface of either the exposed or unexposed regions of the resist, depending on the chemistry of the resist. This effectively creates an etch barrier which, upon oxidation, is chemically resistant to an $O_2$ plasma. In the instant invention, silylation of the photoresist 22 predominantly incorporates silicon into the unexposed patterned areas 32 via a chemical photoresist to from silylated areas 32 via a chemical reacton. The silylated areas 32 penetrate approximately 1000-3000 Å below the surface 30 of resist layer 22 and may further undergo swelling above the surface 30. Since some silicon invariably is incorporated in the crosslinked regions as well, this tends to result in micromasking in the areas. That is, some incorporation of silicon occurs on the top surface 34 of the exposed patterned crosslinked areas 26 of the photoresist 22 (FIG. 1(c)), forming micormasks. Silylation selectivlity is the differential in permeability of the silylating agent into the unexposed versus exposed areas of the resist. Selectivity, or silylation contrast, can be a critical element in the pattern transferring process of prior processes, however, the selectivity is less critical in the process of the present invention.

The device structure is baked again at 100°-130° C. for 2 minutes and transferred to the RFI tool for RIE with $O_2$ gas alone.

Figure 1D:
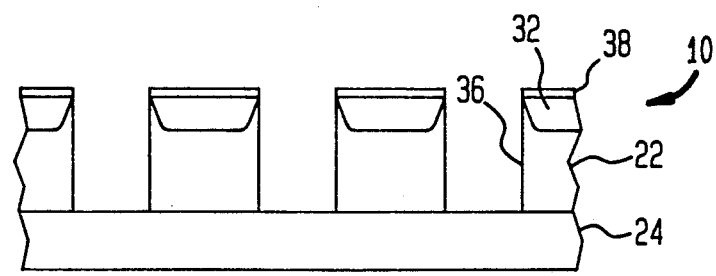

Etching of the patterned photoresist 22 utilizing a high density, low pressure, anisotropic $O_2$ plasma alone to produce residue-free images with vertical wall profiles 36 in the photoresist 22 is then performed (FIG. 1(d)). That is, the wafer 24 with patterned resist 22 is placed in the previously described RFI processor, the wafer structure being held in place by the electrostatic chuck. The temperature of the wafer structure can be controlled during the processing steps via the previously described electrostatic chuck having helium backside cooling. Subsequent etching of the patterned photoresist 22 is then performed. An etchant gas of $O_2$ alone is used for etching the patterned photoresist 22 in combination with the following set of etch parameters:

Inductive Power (13.56 MHz): 300-600 Watts;
RF Bias (40 MHz): 100-500 Watts;
$O_2$ Pressure: 0.5-10.0 mTorr; and
Gas Flow: 10-50 sccm.

According to the invention, key conditions of the high density $O_2$ plasma comprise the plasma being generated under very low pressure and high vacuum. Plasma density is a measure of the concentration of ions per unit volume. Under low pressure, high vacuum conditions, the mean free path (MFP) between ions of opposite polarity in the high density plasma large in comparison to the MFP between ions in a high density plasma generated under high pressure, low vacuum conditions. In the case of high pressure, low vacuum conditions, MFP between ions in the high density plasma is small and particles or ions of opposite polarity have a greater probability of recombining. The high density plasma generated under high pressure, low vacuum conditions is therefore unstable and difficult to maintain because, with the small MFP, the plasma neutralizes itself rapidly.

In further discussion of the high density $O_2$ plasma, it comprises an $O_2$ gas which is broken down into positive and negative species of ions and radicals. Si bonds are broken by collisions with the species in which an initial collision produces a volatile species of partially oxidized organo silicon and subsequent collisions produce non-volatile $SiO_2$. Under the above described etch conditions according to the invention, the high vacuum and low pressure conditions reduce the possibility for the occurrence of the multiple collisions, and thus, reduces or eliminates the possibility for the formation of "grass" in undesired areas of the TSI resist. Thus, the desired formation of residue free images with TSI resists is accomplished by a single-step oxygen reactive ion etching process.

Recalling that the silylation of the imaged resist produces some unwanted Si on the top surface of exposed cross-linked regions 26, the effect of the high vacuum, low pressure, high density $O_2$ plasma of the present invention with TSI resists is to create a good (Si/no Si) differential where it doesn't exist in the first place. That is, the effects of the unwanted Si going into undesired areas, such as described above, are minimized due to the high ion plasma density, low pressure, high vacuum $O_2$ plasma conditions.

In a preferred embodiment, the RFI processor is controlled for producing a high density plasma in the reactor under the following preferred device etch parameters:

Inductive Power (13.56 MHz): 500 Watts ;
RF Bias (40 MHz): 300 Watts ;
$O_2$ Pressure: 2 mTorr ; and
Gas Flow: 20 sccm .

Using the preferred RFI etch parameters, etching of the photoresist layer 22 was observed to be essentially complete in 1-2 minutes depending on resist thickness and as detected by an end point. The endpoint was detected while monitoring changes in the intensity of photoemission of excited species. The plasma was kept on for an additional 5-10 seconds beyond detection of the endpoint. This produces an etch rate of between 0.5 and 2.5 μm per minute, wherein no detectable damage to the resist mask 22 nor any resist image deformation was observed. The obtainable etch rate of 0.5 to 2.5 μm/min is commensurate in scope with "clustered" manufacturing of submicron semiconductor device, enabling high throughput.

Figure 2:
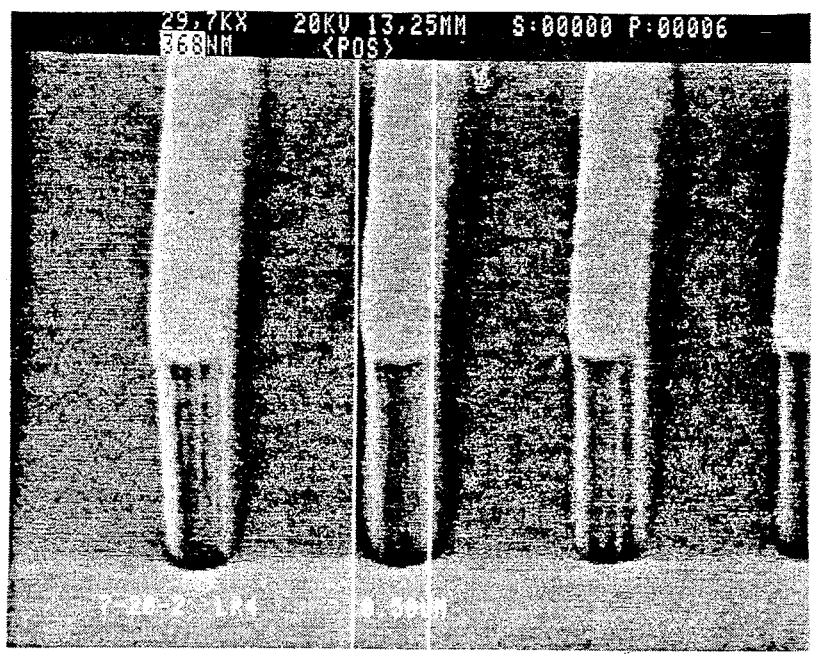
FIG. 2 shows an SEM micrograph of a TSI resist patterned according to a preferred embodiment of the present invention.
Figure 3:
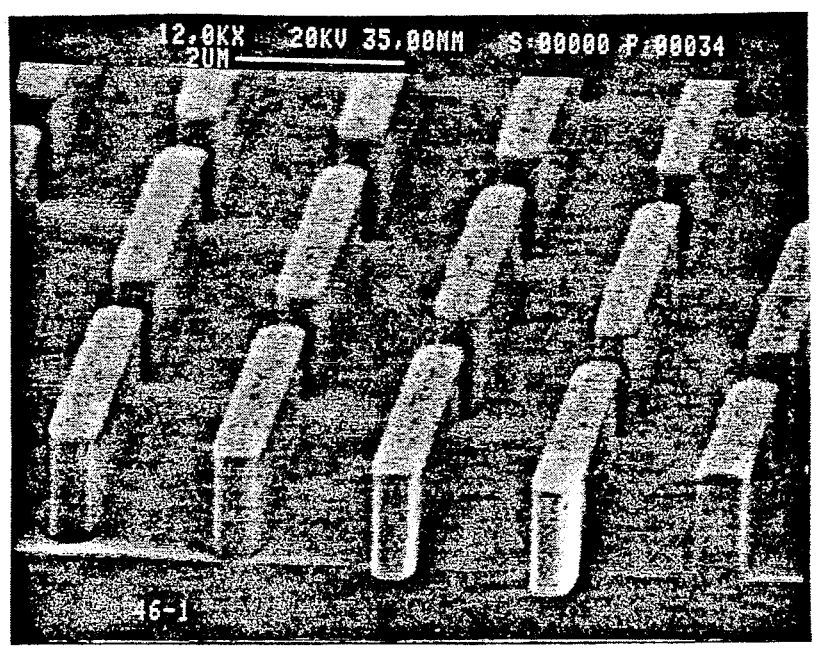
FIG. 3 shows an SEM micrograph of a TSI resist patterned according to the preferred embodiment of the present invention.

Furthermore, SEM examination of the etched patterns shows vertical wall profiles with no evidence of any residue. For example, FIG. 2 and FIG. 3 show SEM micrographs of an etched pattern with the resist layer 22 still in place, the pattern having 0.5 μm lines and 1.0 μm spacing. Thus, the method of the present invention further provides residue-free images with vertical wall profiles in the fabrication of submicron feature devices.

In the above example, a 5 inch (127 mm) wafer was used. For scale-up to 8 inch (203 mm) wafer size, appropriate size pumping system should be used to achieve the critical parameters given above.

Figure 4:
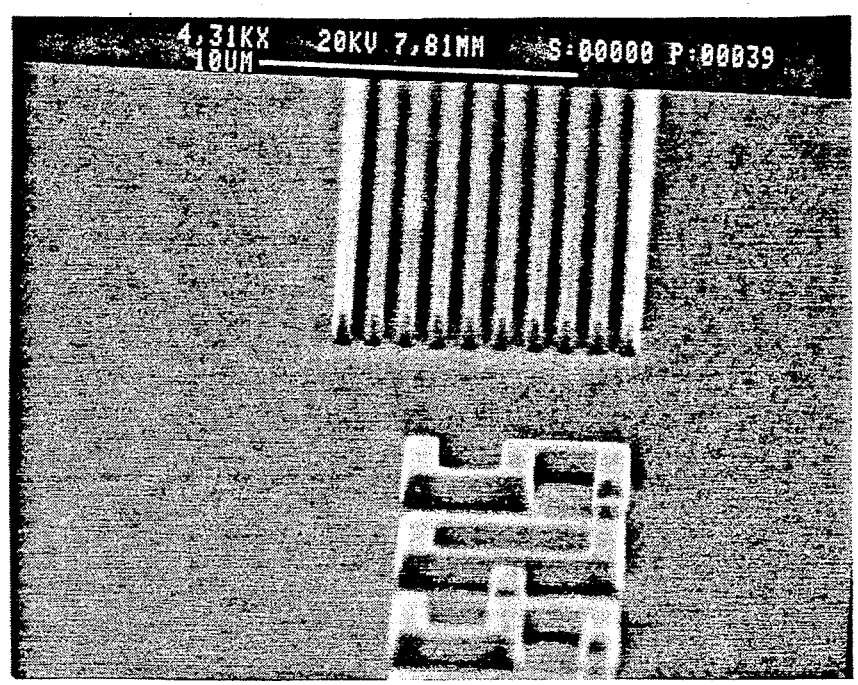
FIG. 4 shows an SEM micrograph of a TSI resist patterned according to an alternate embodiment of the present invention.

In an alternate embodiment of the present invention, the method is similar to the preferred embodiment except that in the alternate embodiment, the method is carried out using an Electron Resonance Cyclotron (ECR) reactor, such as an ECR reactor available from Sumitomo Metals of Japan (marketed by Lam Corporation, Fremont, California, USA). ECR reactors are known in the art and are therefore only briefly discussed herein. With the ECR reactor, a microwave generator is used to produce a plasma which is confined by an axial magnetic field. The magnetic field strength is chosen to create a condition of electron cyclotron resonance (ECR) by the formula:

$$w = eB/m$$

where w is the microwave frequency (in radians), e is the electron charge, m is the electron mass, and B is the magnetic field strength. For typical microwave frequencies of 2.45 GHz, a magnetic field strength of just under 1000 gauss is sufficient to achieve a resonant zone in the plasma. The resonance creates a high density plasma due to electrons being confined to a circular orbit defined by the crossed electric and magnetic fields. The microwave generator of the ECR reactor is used to produce the high density low pressure $O_2$ plasma used in accordance with the alternate embodiment of the present invention. The other etch parameters for creating the desired plasma using the ECR reactor include: microwave power: 1300 Watts; RF Bias: 50 Watts; $O_2$ Pressure: 0.6 mTorr; and $O_2$ Flow Rate 40 sccm. An etch rate of up to 1.0 μm per minute is obtainable. FIG. 4 provides an SEM of a TSI resist etched according to the alternate embodiment of the present invention.

In yet another alternate embodiment, the method of the present invention is similar to the preferred embodiment, the difference being that the high density, low pressure, $O_2$ plasma is produced using a helicon based plasma reactor or source. A helicon based plasma reactor based on the research of Robert Boswell at the Australian National University, Canberra has been licensed and is manufactured by Lucas-Signatone. This reactor has been used successfully for etching of top surface photoresists according to the present invention. Helicon sources are known in the art and therefor only briefly discussed herein. Helicon sources rely on launching a slow wave structure at radio frequencies. The helicon is powered by RF driven coils mounted on opposite sides of a vacuum chamber. By proper choice of polarity and aspect ratio, the coils launch slow moving plasma waves. The slow waves are known as helicon waves and the resulting plasma can be high in density, particularly if additional multipolar magnetic field confinement is added. The helicon plasma has a very high absorption efficiency. Typical etch parameters used in such a helicon reactor are: 2 mTorr pressure, 50 sccm $O_2$, 2500 Watts helicon RF, 200 Watts substrate RF bias, −50° C. substrate temperature (cryogenic). Typical etch rates under these conditions are up to 1 μm per minute.

There is thus provided a method for patterning a photoresist layer in the fabrication of submicron semiconductor devices using top surface imaging which provides high etch rates for etching the photoresist with straight wall profiles, and further provides a highly efficient process. The method further provides residue free images.

While the invention has been particularly shown and described with respect to the preferred and alternate embodiments thereof, it will be understood by those skilled in the art that the foregoing and other changes in form and detail may be made therein without departing from the spirit and scope of the invention.

What is claimed is:

1. A method for transferring a pattern through a photoresist layer in the fabrication of submicron semiconductor device structures, said method comprising the steps of:
   a) providing a photoresist on a substrate;
   b) imagewise exposing the photoresist with a desired pattern to form exposed and unexposed patterned areas in a top surface of the photoresist;
   c) baking the photoresist to form cross-linked regions in the exposed patterned areas of the photoresist, hereafter referred to as exposed patterned cross-linked areas;
   d) silylating the photoresist to incorporate silicon into the unexposed patterned area of the photoresist, wherein some incorporation of silicon occurs in the exposed patterned cross-linked areas of the photoresist; and
   e) etching the photoresist utilizing a high density, low pressure, anisotropic $O_2$ plasma alone to produce residue-free images with vertical wall profiles in the photoresist, wherein the high density, low pressure anisotropic $O_2$ plasma is generated by radio frequency induction (RFI) in a RFI reaction chamber having magnetic confinement of the plasma, the chamber operating with an inductive power in the range of 300–500 Watts applied to an RF coil; and RF bias in the range of 100–300 Watts applied to the substrate; a chamber pressure in the range of 0.5 to 10 mTorr; and a gas flow in the range of 10–50 sccm, etching the photoresist at a rate of 0.5–2.5 μm per minute,
   whereby the exposed patterned cross-linked areas are completely etched, including any exposed cross-linked patterned areas incorporating some silicon, and the unexposed silylated patterned areas remain with no detectable damage occurring to the unexposed silylated patterned areas nor any image deformation occurring to the exposed and unexposed patterned areas.

2. The method of claim 1, wherein the photoresist of step a) comprises a photoresist layer having a thickness in the range of 1-2 μm.

3. The method of claim 1, still further wherein the step e) etching occurs in a RFI reaction chamber having magnetic confinement of the plasma, the chamber operating with an inductive power of 500 Watts applied to an RF coil; an RF bias of 300 Watts applied to the substrate; a chamber pressure of 2 mTorr; and a gas flow of 20 sccm.

4. The method of claim 3, wherein the photoresist of step a) comprises a photoresist layer having a thickness in the range of 1–2 μm.

* * * * *

UNITED STATES PATENT AND TRADEMARK OFFICE
CERTIFICATE OF CORRECTION

PATENT NO.   : 5,312,717
DATED        : May 17, 1994
INVENTOR(S)  : Harbans S. Sachdev, et al.

It is certified that error appears in the above-identified patent and that said Letters Patent is hereby corrected as shown below:

In column 1, line 25:   delete "and Roland" and replace it with --and B. Roland"--.

In column 4, line 66:   change "ngw" to  --now--

In column 6, line 5:   change "300-600" to --300-500--.

In column 6, line 6:   change "100-500" to --100-300--.

In column 8, line 50:   change "and" to --an--.

Signed and Sealed this

Sixth Day of June, 1995

BRUCE LEHMAN

*Attest:*

*Attesting Officer*   *Commissioner of Patents and Trademarks*